United States Patent
Hirano et al.

(10) Patent No.: US 8,324,623 B2
(45) Date of Patent: Dec. 4, 2012

(54) SEMICONDUCTOR CHIP, SEMICONDUCTOR MOUNTING MODULE, MOBILE COMMUNICATION DEVICE, AND PROCESS FOR PRODUCING SEMICONDUCTOR CHIP

(75) Inventors: Koichi Hirano, Osaka (JP); Tetsuyoshi Ogura, Osaka (JP); Seiichi Nakatani, Osaka (JP)

(73) Assignee: Panasonic Corporation, Osaka (JP)

( * ) Notice: Subject to any disclaimer, the term of this patent is extended or adjusted under 35 U.S.C. 154(b) by 63 days.

(21) Appl. No.: 13/080,152

(22) Filed: Apr. 5, 2011

(65) Prior Publication Data

US 2011/0180900 A1     Jul. 28, 2011

Related U.S. Application Data

(62) Division of application No. 12/377,076, filed as application No. PCT/JP2007/066409 on Aug. 24, 2007, now Pat. No. 7,943,518.

(30) Foreign Application Priority Data

Sep. 21, 2006  (JP) .................................. 2006-255585

(51) Int. Cl.
 *H01L 21/00* (2006.01)
(52) U.S. Cl. ............ 257/57; 257/62; 257/300; 257/330; 257/E21.414; 257/E21.616
(58) Field of Classification Search .................... 257/57, 257/62, 65, 300, 330, E21.414, 616, 29.273, 257/291
See application file for complete search history.

(56) References Cited

U.S. PATENT DOCUMENTS

| | | | |
|---|---|---|---|
| 3,898,539 A | | 8/1975 | Yoshimura et al. |
| 4,288,775 A | | 9/1981 | Bennewitz et al. |
| 6,242,111 B1 | | 6/2001 | Telford et al. |
| 6,525,921 B1 | * | 2/2003 | Nakatani et al. ........... 361/306.3 |
| 6,624,589 B2 | | 9/2003 | Kitamura et al. |
| 6,713,188 B2 | | 3/2004 | Wu et al. |
| 6,933,664 B2 | | 8/2005 | Kitamura et al. |
| 6,943,488 B2 | | 9/2005 | Yasui et al. |
| 7,013,561 B2 | * | 3/2006 | Nakatani et al. ................. 29/852 |
| 2003/0116348 A1 | * | 6/2003 | Nakatani et al. .............. 174/260 |
| 2004/0067605 A1 | | 4/2004 | Koizumi |
| 2010/0012936 A1 | * | 1/2010 | Hirano et al. .................... 257/57 |
| 2011/0049598 A1 | * | 3/2011 | Hirano et al. .................. 257/300 |

FOREIGN PATENT DOCUMENTS

| | | |
|---|---|---|
| JP | 49-000393 | 1/1974 |
| JP | 07-312414 | 11/1995 |
| JP | 08-250659 | 9/1996 |
| JP | 2001-203455 | 7/2001 |
| JP | 2001-267183 | 9/2001 |
| JP | 2002-033453 | 1/2002 |
| JP | 2004-128219 | 4/2004 |
| JP | 2004-172154 | 6/2004 |
| JP | 2006-028669 | 2/2006 |
| JP | 2006-120948 | 5/2006 |

\* cited by examiner

*Primary Examiner* — Michael Lebentritt
(74) *Attorney, Agent, or Firm* — McDermott Will & Emery LLP

(57) ABSTRACT

A semiconductor chip comprising a capacitor capable of effectively controlling the voltage drop of an LSI is provided. A semiconductor substrate is provided with an element electrode having at least its surface constituted of an aluminum electrode. The surface of the aluminum electrode is roughened. An oxide film is provided on the aluminum electrode. A conductive film is provided on the oxide film. The aluminum electrode, oxide film and conductive film form a capacitor.

9 Claims, 6 Drawing Sheets

F I G. 7
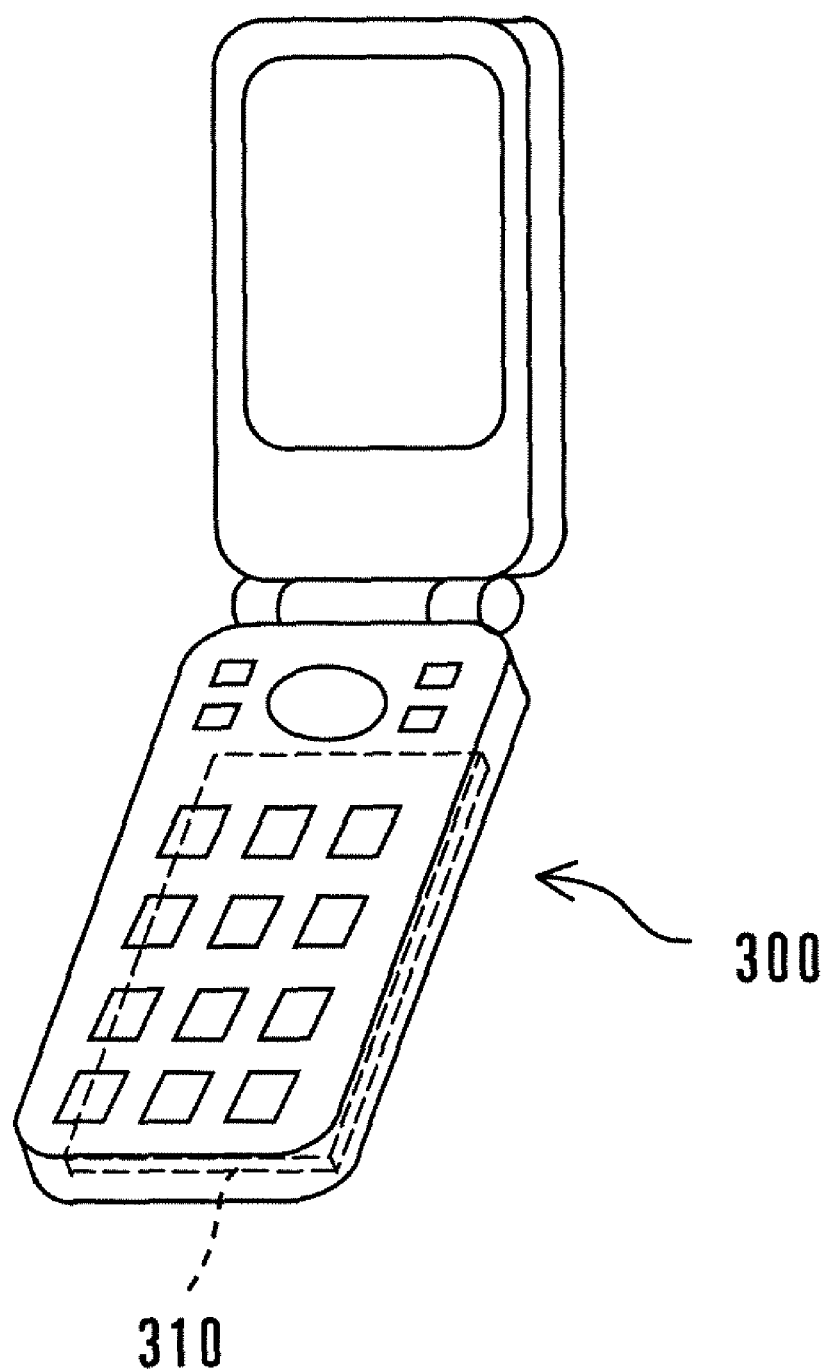

SEMICONDUCTOR CHIP, SEMICONDUCTOR MOUNTING MODULE, MOBILE COMMUNICATION DEVICE, AND PROCESS FOR PRODUCING SEMICONDUCTOR CHIP

RELATED APPLICATIONS

This application is a Divisional of U.S. patent application Ser. No. 12/377,076, filed on Feb. 10, 2009 now U.S. Pat. No. 7,943,518, which is a U.S. National Phase under 35 U.S.C. §371 of International Application No. PCT/JP2007/066409, filed on Aug. 24, 2007, which in turn claims the benefit of Japanese Application No. 2006-255585, filed on Sep. 21, 2006, the disclosures of which Applications are incorporated by reference herein.

FIELD OF THE INVENTION

The present invention relates to a semiconductor chip, more particularly to a semiconductor chip where capacitors are formed on electrodes. The present invention further relates to processes for forming a semiconductor mounting module comprising the semiconductor chip thus constituted and the capacitor.

BACKGROUND OF THE INVENTION

When a load is suddenly applied to a semiconductor integrated circuit (hereinafter, referred to as LSI), a voltage drop occurs due to a parasitic resistance and a parasitic inductance present in wirings between a power supply and the LSI. At the time, the voltage drop is more increased as the parasitic resistance and the parasitic inductance are larger and a load current variation time is shorter. In recent years, the operation frequency of an LSI is as large as a few-hundred MHz or the order of a GHz, and a clock rising time is thereby significantly shortened. Therefore, the voltage drop is increasingly larger, which often causes the malfunctioning of the LSI (for example, see the Patent Document 1).

In order to lessen the voltage drop, it is effective to provide capacitors in parallel between a power supply line and a ground line of the LSI. The capacitors thus provided are generally called decoupling capacitors or bypass capacitors.

In order to control the voltage drop of the LSI, the decoupling capacitors are preferably provided as close to the LSI as possible because a wiring length is increased when the capacitors are distant from the LSI, and an L component (inductance component) is increased, which unfavorably causes a delay. A structure often adopted to deal with the disadvantage is to provide decoupling capacitors 13 in close vicinity of a semiconductor chip (LSI) 12 mounted on a printed substrate 11 as illustrated in FIG. 1.
Patent Document 1: 2002-33453 of the Japanese Patent Applications Laid-Open

DISCLOSURE OF THE INVENTION

Problem to be Solved by the Invention

The layout example illustrated in FIG. 1, however, increases a mounting area on the printed substrate, which is disadvantageous in terms of the reduction of the dimensions and the weight of an electronic device. As the electronic devices are increasingly reduced in size, thinner, and highly-functional, the mounting area for electronic parts mounted on the printed substrate is subject to more restrictions. In the case of a printed substrate loaded in a mobile telephone, for example, though it is empirically known that decoupling capacitors are preferably provided in the periphery of the LSI as close thereto as possible, it is actually difficult to secure an area on the wiring substrate on which they are mounted, or the mounting of the decoupling capacitors puts more restrictions on an area where other parts are mounted.

The Patent Document 1 disclosed a constitution wherein thin-film capacitors are formed on an uppermost insulation film of a semiconductor device (LSI). Decoupling capacitors provided for controlling the voltage drop of the LSI are required to have a relatively large capacity. The thin-film capacitor recited in the Patent Document 1 structurally does not have enough capacity to control the voltage drop of the LSI.

As described, in the conventional technology, it is difficult to secure a capacity which the capacitor is required to have to control the voltage drop of the LSI and to solve the problem of a mounting area.

The present invention was made to solve the foregoing problems, and a main object thereof is to provide a semiconductor chip comprising capacitors suitable for controlling the voltage drop of an LSI.

Means for Solving the Problem

A semiconductor chip according to the present invention has a semiconductor substrate provided with an element electrode having at least its surface constituted of an aluminum electrode, wherein
  surface of the aluminum electrode is roughened,
  an oxide film is provided on the aluminum electrode,
  an electrically conductive film is provided on the oxide film, and
  the aluminum electrode, the oxide film and the conductive film constitute a capacitor.

In a preferred embodiment of the present invention, the surface of the aluminum electrode is roughened so as to have at least a 50-fold surface expansion ratio.

In another preferred embodiment of the present invention, the surface of the aluminum electrode is roughened so as to have at least a 50-fold to 120-fold surface expansion ratio.

In still another preferred embodiment of the present invention, the surface of the aluminum electrode is roughened so as to have at least a 100-fold surface expansion ratio.

In still another preferred embodiment of the present invention, conductive polymer molecules constitute the conductive film.

In still another preferred embodiment of the present invention, a part of the element electrode is covered with a passivation film.

In still another preferred embodiment of the present invention, a plurality of metallic layers constitute the element electrode, a lowermost layer of the plurality of metallic layers is formed on the semiconductor substrate, and the aluminum electrode is formed on the lowermost layer with a underlaying electrode interposed therebetween.

A semiconductor mounting module according to the present invention comprises the semiconductor chip and a mounting substrate on which the semiconductor chip is mounted.

In a preferred embodiment of the present invention, a mobile communication device comprises the semiconductor mounting module according to the present invention.

A process for producing a capacitor according to the present invention comprises steps of:

preparing a semiconductor chip comprising a plurality of element electrodes;

forming underlaying electrodes on a surface of the semiconductor chip on which the plurality of element electrodes are formed so as to cover the plurality of element electrodes;

forming aluminum electrodes selectively on surface sections of the underlaying electrodes respectively positioned above the element electrodes;

roughening surfaces of the aluminum electrodes and forming an oxide film on the aluminum electrodes by anodizing the aluminum electrodes in a state where a voltage is applied to the underlaying electrodes; and forming a conductive film on the oxide film.

Effect of the Invention

According to the present invention, wherein the capacitor is formed on the aluminum electrode of the semiconductor chip, a decoupling capacitor can be located at a position very close to the semiconductor chip. Further, the capacitor, which has the oxide film (dielectric member) having a large surface area formed on the roughened surface, has a relatively large capacity. Therefore, the voltage drop of the semiconductor chip (LSI) can be effectively controlled, and the disadvantage of the mounting area can be cleared at the same time.

BRIEF DESCRIPTION OF THE DRAWINGS

FIG. 7 is a perspective view schematically illustrating a mobile communication device according to the preferred embodiment.

Figure 1:
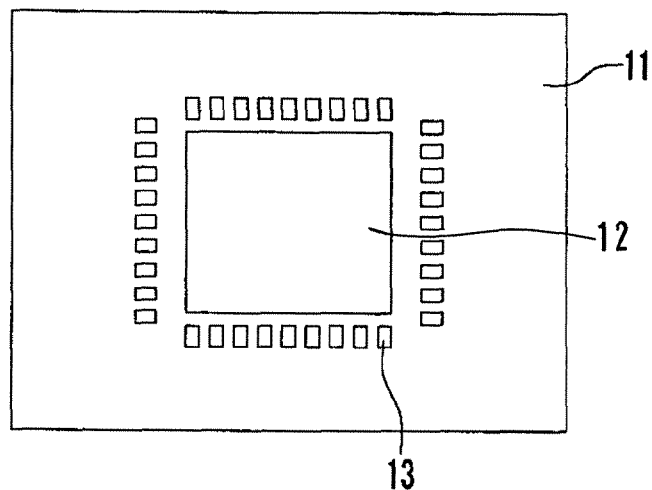
FIG. 1 is an upper view illustrating an example of a constitution where decoupling capacitors are provided in the periphery of a semiconductor chip.

DESCRIPTION OF REFERENCE SYMBOLS 10 substrate (semiconductor substrate)
11 printed substrate
13 decoupling capacitor
20 aluminum electrode (element electrode)
20A aluminum electrode (upper electrode)
22 oxide film
24 conductive film (solid electrolyte)
26 carbon paste
27 Ag paste
28 Ni/Au plated electrode (barrier metal)
30 passivation film
40 underlaying electrode (power feeding layer)
42 photoresist
43 opening
50 capacitor
100 semiconductor chip
200 semiconductor mounting module
300 mobile communication device

PREFERRED EMBODIMENT OF THE PRESENT INVENTION

The inventors of the present invention investigated what kind of layout is preferable for decoupling capacitors (or bypass capacitors) on a printed substrate of an electronic device (for example, a mobile communication device) subject to strict restrictions in a mounting area thereof. The decoupling capacitors are preferably provided as close to the semiconductor chip as possible because influences from an L component can be thereby avoided. However, it is actually difficult to secure a mounting area for the decoupling capacitors, by giving them a very high priority, on the printed substrate on which components are desired to be densely mounted. Under the circumstances, the inventors of the present invention came up with such an idea that the capacitors are directly formed on the element electrodes (aluminum electrodes) of the semiconductor chip. However, it is still difficult to secure a capacity necessary for controlling the voltage drop of the LSI in the case where the capacitors are simply formed on the semiconductor chip as in the case of the constitution disclosed in the Patent Document 1 (2002-33453 of the Japanese Patent Applications Laid-Open).

Based on the findings described above, the inventors of the present invention examined a process for forming the decoupling capacitor which can secure a relatively large capacity on the aluminum electrode, and finally completed the present invention.

Hereinafter, a preferred embodiment of the present invention is described referring to the drawings. In the drawings below, structural elements having substantially the same function are illustrated with the same reference symbols attached thereto in order to simplify the description. The present invention is not limited to the preferred embodiment described below.

Referring to FIGS. 2A, 2B, 3A and 3B, a semiconductor mounting module according to the present preferred embodiment is described.

Figure 2A:
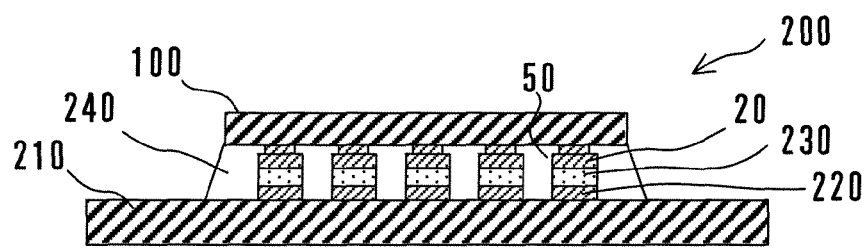
FIG. 2A is a sectional view schematically illustrating a constitution of a semiconductor mounting module 200 according to a preferred embodiment of the present invention.
Figure 2B:
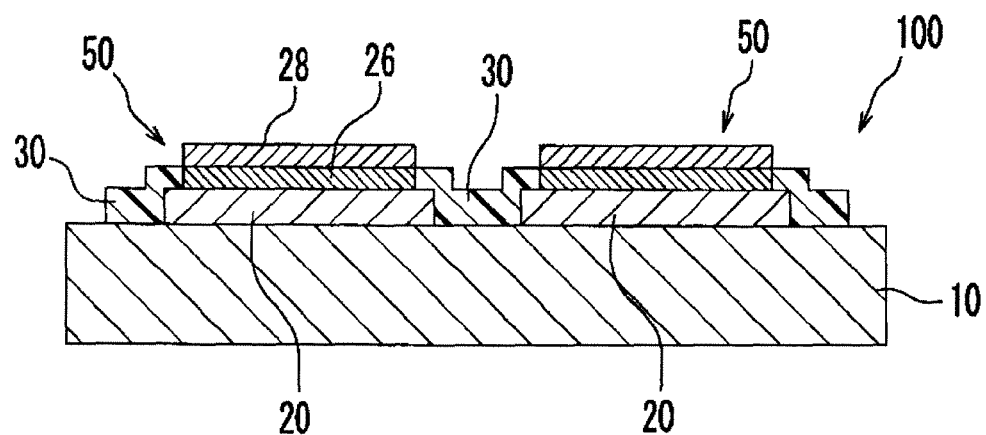
FIG. 2B is a sectional view schematically illustrating a constitution of a semiconductor chip 100 according to the preferred embodiment.
Figure 3A:
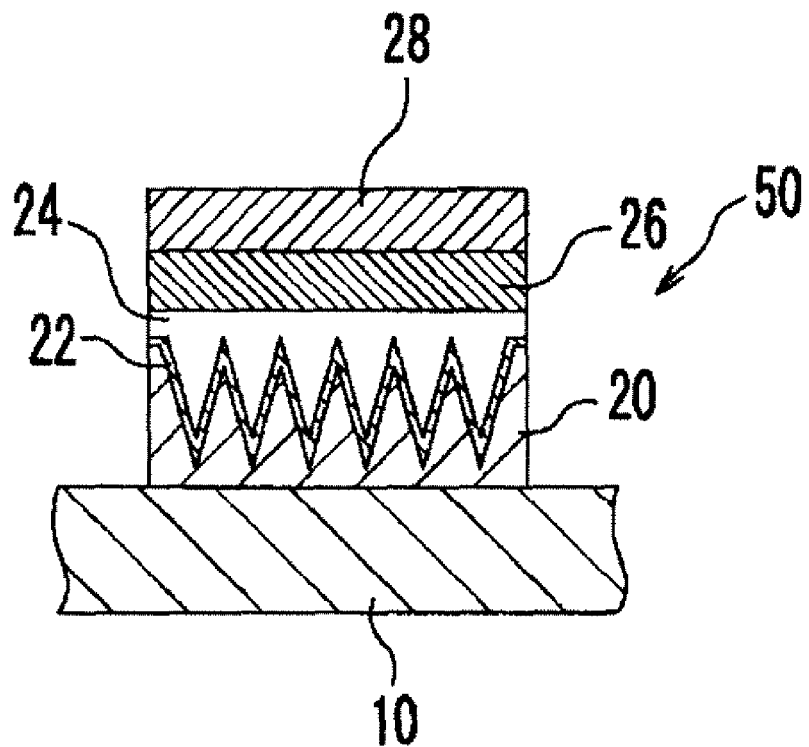
FIG. 3A is a sectional view schematically illustrating a constitution of a main section of a capacitor 50 according to the preferred embodiment.
Figure 3B:
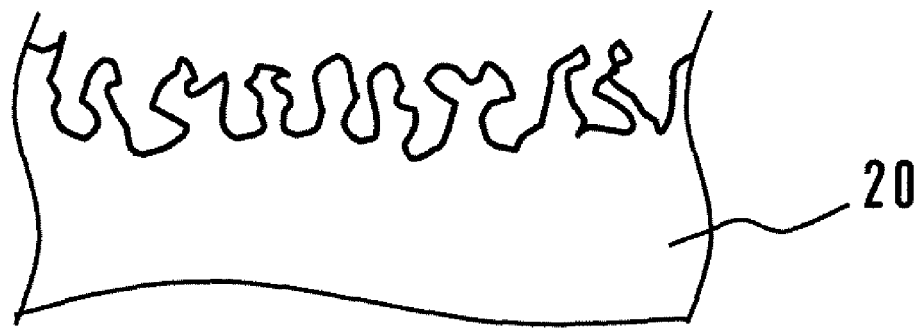
FIG. 3B is another sectional view schematically illustrating the constitution of the main section of the capacitor 50 according to the preferred embodiment.

FIG. 2A illustrates an entire structure of a semiconductor mounting module 200. FIG. 2B schematically illustrates a cross-sectional structure of a main section of a semiconductor chip 100 according to the preferred embodiment. FIGS. 3A and 3B schematically illustrate a structure of a capacitor 50 formed on the element electrode of the semiconductor chip 100 according to the preferred embodiment.

The semiconductor mounting module 200 according to the preferred embodiment comprises a mounting substrate 210 and the semiconductor chip (semiconductor integrated circuit) 100 as illustrated in FIG. 2A. The semiconductor chip 100 is mounted on a surface (upper surface in the drawings) of the mounting substrate 210. Substrate electrodes 220 are provided on a surface of the mounting substrate 210, and aluminum electrodes (element electrodes) 20 are provided on a bottom surface (lower surface in the drawings) of the semiconductor chip 100. The substrate electrodes 220 and the aluminum electrodes (element electrodes) 20 correspond to each other, and the electrodes 210 and 20 face each other when the semiconductor chip 100 is mounted on the mounting substrate 210. Between the substrate electrodes 210 and the aluminum electrodes (element electrodes) 20 facing each other are provided solders 230. The substrate electrodes 210 and the aluminum electrodes (element electrodes) 20 are respectively electrically connected to each other by the solders 230. The sections where the semiconductor chip 100 and the mounting substrate 210 are connected to each other are sealed with sealing resin 240.

The semiconductor chip 100 comprises a substrate (semiconductor substrate) 10 as illustrated in FIG. 2B. The substrate 10 is made up of silicon or the like, and a semiconductor integrated circuit (LSI, not shown) is incorporated therein. The aluminum electrodes (element electrodes) 20 are electrically connected to the semiconductor integrated circuit. In at least one of the aluminum electrodes (element electrodes) 20, a capacitor 50 is formed.

FIG. 3A is an enlarged view of the capacitor 50. FIG. 3B illustrates a main section of the capacitor 50 illustrated in FIG. 3A further enlarged. As illustrated in FIGS. 3A and 3B, surfaces of the aluminum electrodes (element electrodes) 20 are roughened. According to the present invention, to roughen the surface is to increase a surface expansion ratio, and more specifically, a surface is defined as roughened when its surface expansion ration is 50-fold or more. Further, the present invention regards 50-fold to 120-fold surface expansion ratios as suitable, and a 100-fold surface expansion ratio or so as optimal. As illustrated in FIG. 3B, the roughened surface of the aluminum electrode (element electrode) 20 has a complicated shape like branches of a tree and is in a so-called sponge state.

An oxide film 22 is formed on the roughened surface. The oxide film 22 is an aluminum oxide film constituting the aluminum electrode (element electrode) 20. More specifically, the oxide film 22 is formed such that the surface of the aluminum electrode (element electrode) 20 is roughened and then oxidized. A conductive film (solid electrolyte) 24 is formed on the oxide film 22. A solid electrolyte, conductive polymer molecules or the like (for example, polypyrrole, polythiofuran, polyaniline) constitutes the conductive film (solid electrolyte) 24 according to the present preferred embodiment.

In the constitution according to the present preferred embodiment, the aluminum electrode (element electrode) 20, oxide film 22 and conductive film (solid electrolyte) 24 constitute the capacitor 50. More specifically, the aluminum electrode (element electrode) 20 constitutes a lower electrode, the conductive film (solid electrolyte) 24 constitutes an upper electrode, and the oxide film 22 therebetween constitutes a dielectric member. In the illustrated example, carbon pastes 26 are deposited on the conductive film (solid electrolyte) 24, and Ni/Au plated electrodes (barrier metal) 28 are formed thereon.

In the present preferred embodiment, a part of the aluminum electrodes (element electrodes) 20 is covered with a passivation film 30 formed on the substrate (semiconductor substrate) 10. The passivation film 30 is, for example, a film made up of nitride (SiN film or the like) or a polyimide film and protects the surface of the substrate (semiconductor substrate) 10. Further, the substrate (semiconductor substrate) 10 is not necessarily a silicon substrate, and may be a substrate made up of other semiconductor materials (for example, SiC substrate, GaN substrate) or a substrate in which a semiconductor layer is formed on at least a surface, such as a SOI substrate.

In the semiconductor chip 100 according to the present preferred embodiment, the surface of the aluminum electrode (element electrodes) 20 is roughened, and the aluminum oxide film 22 is formed on the roughened surface, so that the capacitor 50 is formed. In the presence of the capacitor 50 formed on the aluminum electrode (element electrode) 20 of the semiconductor chip 100, the decoupling capacitor cab be placed at a position very close to the semiconductor chip 100 such as LSI. Accordingly, the L component (inductance element) can be cut substantially to zero. Further, the dielectric member (oxide film 22) constituting the capacitor 50 according to the present preferred embodiment is formed on the surface of the roughened surface of the aluminum electrode (element electrode) 20, and the capacity of the capacitor can be thereby easily increased. As a result, the capacitor 50 capable of effectively controlling the voltage drop of the semiconductor chip 100 can be realized. For example, in the case where the surface of the aluminum electrode (element electrode) 20 of 0.1 mm$^2$ is roughened at a the 50-fold to 120-fold surface expansion ratio, the capacitor 50 provided with the aluminum electrode 20 thus constituted has a capacity of 0.1 μF (or more), which is a satisfactory value for a decoupling capacitor.

In addition, since the capacitor 50 according to the present preferred embodiment is formed on the aluminum electrode (element electrode) 20 of the semiconductor chip 100, the conventional disadvantage in a mounting area on the printed substrate can be avoided in comparison to the case wherein the capacitors are separately provided in the periphery of the semiconductor chip. More specifically, since the capacitor 50 is formed on the aluminum electrode (element electrode) 20 in the semiconductor chip 100 according to the present preferred embodiment, the region for the coupling capacitors 13 provided in the periphery of the semiconductor chip 12 in the example illustrated in FIG. 1 becomes unnecessary in the case where the semiconductor chip 100 according to the present preferred embodiment is mounted on the mounting substrate (printed substrate) to form the semiconductor mounting module. The mounting substrate (printed substrate) on which the semiconductor chip 100 is mounted may be any of a rigid substrate, a flexible substrate and a rigid flexible substrate.

Below are examples of dimensions, etc. in the structures illustrated in FIGS. 2A, 2B, 3A and 3B. The substrate (semiconductor substrate) 10 is a silicon substrate having the thickness of 100 μm, and the thickness of the aluminum electrode (element electrode) 20 is 40 μm, and the dimensions thereof are vertically 0.1 mm×horizontally 0.1 mm. The shape of the aluminum electrode (element electrode) 20 is not necessarily rectangular, and may be any of other shapes (for example, circular shape). The conductive film (solid electrolyte) 24 is made of polypyrrole, and the carbon paste 26 has the thickness of 3 μm. An example of the Ni/Au plated electrode (barrier metal) 28 is an Ni/Au plated layer.

A process for producing the capacitor 50 is described referring to FIGS. 4A-4D, 5A, 5B, and 6A-6C.

Figure 4A:
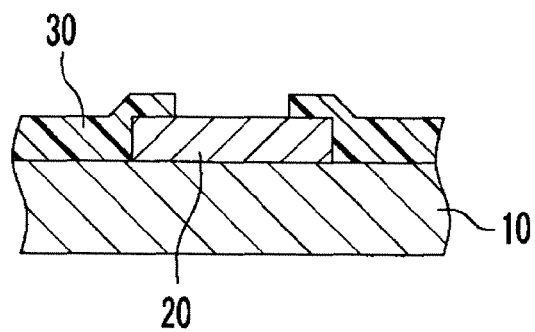
FIG. 4A is a process chart (1) for describing a process for producing the capacitor 50.

As illustrated in FIG. 4A, the semiconductor chip in which the aluminum electrode (element electrode) 20 is formed as the element electrode is prepared. The aluminum electrode (element electrode) 20 is formed on the substrate (semiconductor substrate) 10. In the illustrated example, a part (outer peripheral portion) of the aluminum electrode (element electrode) 20 is covered with the passivation film 20 formed on the substrate (semiconductor substrate) 10; however, the center of the aluminum electrode (element electrode) 20 is exposed.

The semiconductor chip illustrated in this section is a semiconductor device in which the aluminum electrode (element electrode) 20 is formed on the substrate (semiconductor substrate) 10. A semiconductor package in which a bare chip is packaged (for example, chip size package (CSP)) may be used as the semiconductor chip, and the aluminum electrode 20 may be similarly formed in the aluminum electrode (element electrode) 20 of the semiconductor package.

Figure 4B:
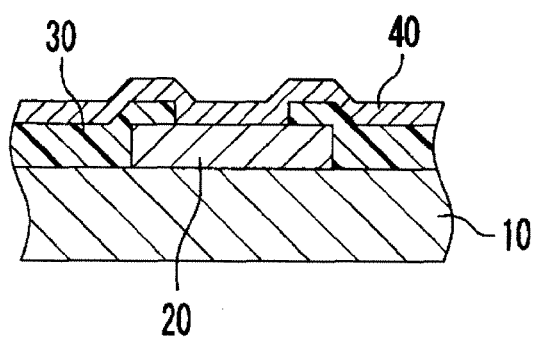
FIG. 4B is a process chart (2) for describing the process for producing the capacitor 50.

As illustrated in FIG. 4B, a underlaying electrode 40 is formed on the substrate (semiconductor substrate) 10 or the passivation film 30 so as to cover the aluminum electrode (element electrode) 20. The underlaying electrode 40 serves as a power feeding layer in an anodizing process implemented later. The underlaying electrode (power feeding layer) 40 is made of, for example, Cr/Cu. The underlaying electrode (power feeding layer) 40 has the thickness of approximately 0.05-2 µm.

Figure 4C:
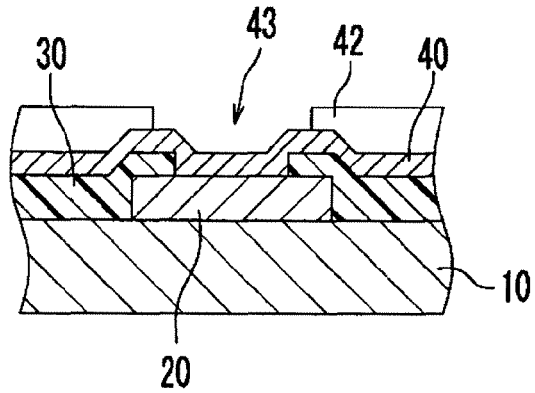
FIG. 4C is a process chart (3) for describing the process for producing the capacitor 50.

As illustrated in FIG. 4C, a photo resist 42 having a predetermined pattern is formed on the underlaying electrode (power feeding layer) 40, and an opening 43 is formed in the photoresist 42 at a position similar to that of the aluminum electrode (element electrode) 20. The opening 43 is formed by means of the photolithography conventionally known.

Figure 4D:
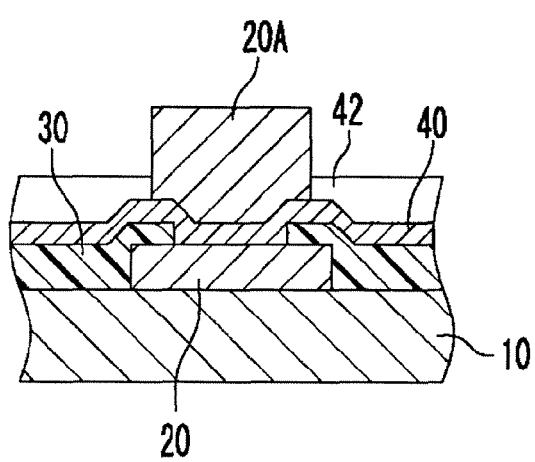
FIG. 4D is a process chart (4) for describing the process for producing the capacitor 50.

As illustrated in FIG. 4D, aluminum is deposited on the underlaying electrode 40 (power feeding layer) 40 through the opening 43 of the photoresist 42, so that an aluminum electrode (upper electrode) 20A is formed. The aluminum electrode (upper electrode) 20A is formed in the thickness of 10-80 µm. In the case where a plurality of layers constitute an element electrode as illustrated in the example, what is necessary is that aluminum constitutes the aluminum electrode (upper electrode) 20A. Therefore, an aluminum electrode (element electrode) 20 lower than the aluminum electrode 20A may be made of other metal (for example, copper).

Figure 5A:
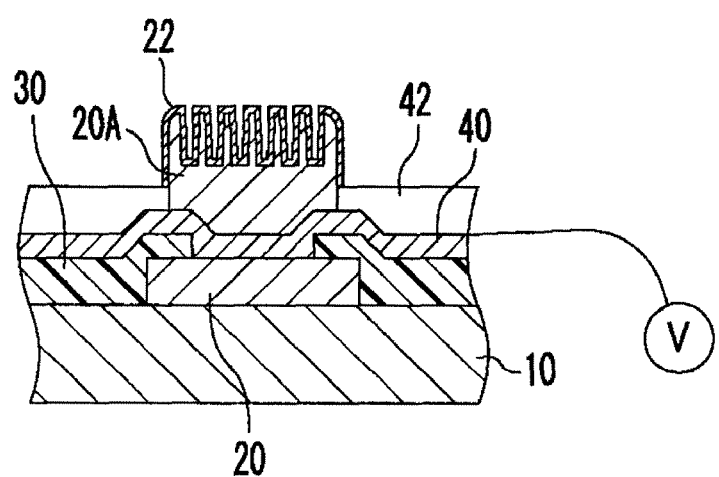
FIG. 5A is a process chart (5) for describing the process for producing the capacitor 50.

As illustrated in FIG. 5A, an alternate current is applied with the underlaying electrode (power feeding layer) 40 serving as the power feeding layer so that the underlaying electrode 40 is subjected to the electrolytic etching in an electrolytic solution in which hydrochloric acid is included as a main constituent in order to roughen a surface thereof. To roughen the surface is to increase the surface expansion ratio of the surface of the underlaying electrode 40. After that, a voltage is applied to the underlaying electrode (power feeding layer) 40 in a neutral electrolytic solution so that the aluminum electrode (upper electrode) 20A is anodized. As a result of the anodizing process, the surface of the aluminum electrode (upper electrode) 20A is further roughened, and the surface expansion ratio is increased to be approximately 50-fold to 120-fold as illustrated in FIG. 3B. Then, the oxide film 20 is further formed thereon. The applied voltage is, for example, approximately 30-100 V. The thickness of the oxide film is, for example, approximately 20-120 nm.

Figure 5B:
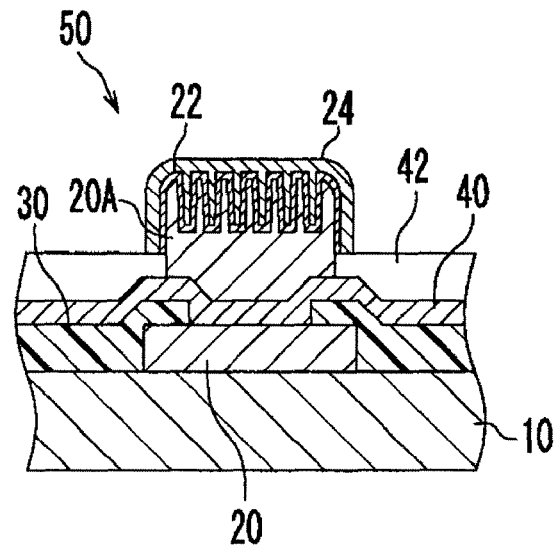
FIG. 5B is a process chart (6) for describing the process for producing the capacitor 50.

After the anodizing process, the conductive film (solid electrolyte) 24 is formed on the substrate (semiconductor substrate) 10 or the passivation film 30 so as to cover the aluminum electrode (upper electrode) 20A on which the oxide film 22 is formed, as illustrated in FIG. 5B. The conductive film (solid electrolyte) 24, which covers the roughened surface of the aluminum electrode (upper electrode) 20A, can fill uneven portions in the roughened surface. At this stage, the conductive layers (20A, 24) are formed with the oxide film 22 as the dielectric layer interposed therebetween. As a result, the capacitor 50 is formed. The thickness of the conductive film (solid electrolyte) 24 is, for example, approximately 1-3 µm.

Figure 6A:
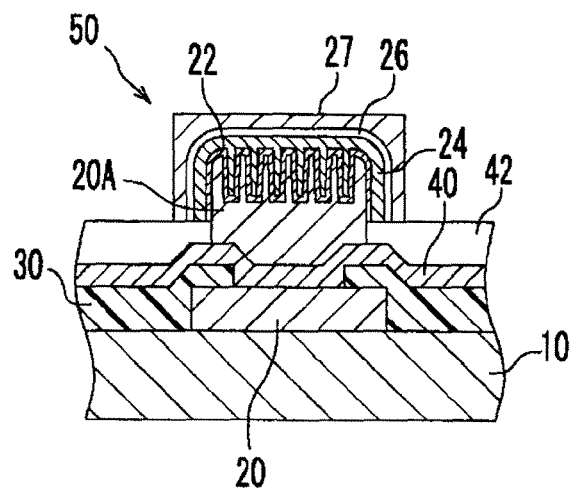
FIG. 6A is a process chart (7) for describing the process for producing the capacitor 50.

As illustrated in FIG. 6A, the carbon paste 26 is deposited on the conductive film (solid electrolyte) 24 which covers the aluminum electrode (upper electrode) 20A. In the present preferred embodiment, an Ag paste 27 is further deposited on the carbon paste 26. The thickness of the carbon paste 26 is, for example, approximately 0.1-5 µm, and the thickness of the Ag paste 27 is, for example, approximately 3-15 µm.

Figure 6B:
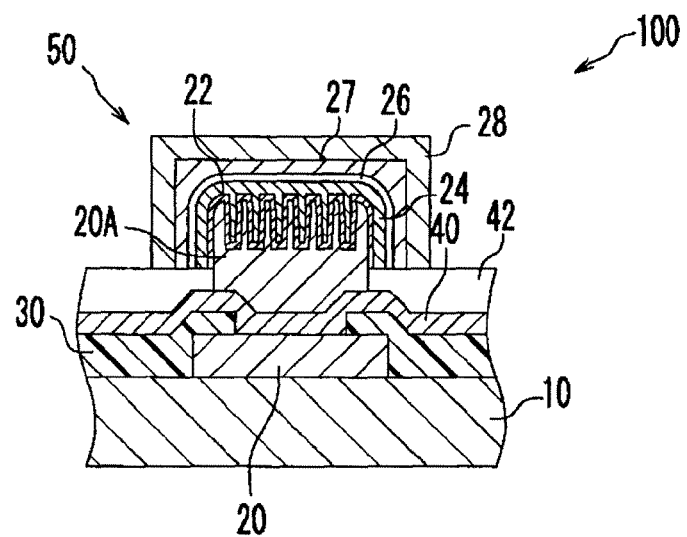
FIG. 6B is a process chart (8) for describing the process for producing the capacitor 50.

As illustrated in FIG. 6B, the Ni/Au plated electrode (barrier metal) 28 is formed on the surface of the Ag paste 27. As a result, the semiconductor chip 100 in which the capacitor 50 is formed on the aluminum electrode 20 (upper electrode) 20A can be obtained.

Figure 6C:
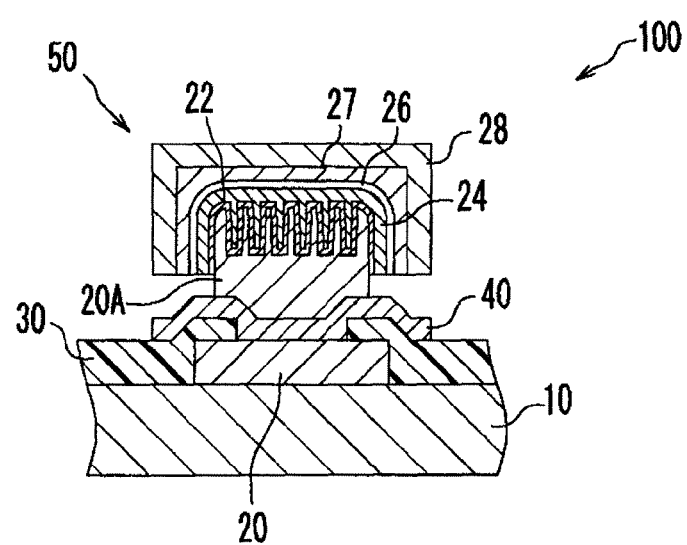
FIG. 6C is a process chart (9) for describing the process for producing the capacitor 50.

If necessary, any unnecessary portions of the photoresist 42 and the underlaying electrode (power feeding layer) 40 are removed as illustrated in FIG. 6C. These portions can be removed such that the photoresist 42 is peeled off by means of an alkali solution and the unnecessary portion of the underlaying electrode (power feeding layer) 40 is etched by means of a conventional etching solution suitable for the material of the underlaying electrode (power feeding layer) 40. A part of the photoresist 42 (for example, a lower portion of the layers constituting the capacitor 50) may be left, or a new material (for example, resin) may be supplied after the photoresist 42 is removed in order to protect the capacitor 50.

In the present preferred embodiment, the aluminum electrode (upper electrode) 20A is provided, and the capacitor 50 is formed thereon. However, the aluminum electrode (element electrode) 20 on the substrate (semiconductor substrate) 10 may be anodized so that the capacitor 50 is formed. In the case where the electrode is made of tantalum or niobium in place of the Al electrode, an oxide film of the used material may be used to form the capacitor. However, the Al electrode is of more technical significance in view of manufacturability and manufacturing costs.

In the case where element electrodes of a semiconductor bare chip and the semiconductor bare chip are mounted on an interposer, and electrodes of the interposer are mounted on a wiring substrate (printed substrate), the capacitor 50 according to the present preferred embodiment may be formed on the electrode of the interposer (electrodes of the semiconductor package including the interposer, or the electrodes of the semiconductor mounting module including the interposer (for example, multi-chip module)).

In the case of the semiconductor chip 100 comprising the capacitor 50 according to the present preferred embodiment, the decoupling capacitors (or bypass capacitors) can be easily provided even on a printed substrate 310 housed in an electronic device (for example, mobile communication device) 300 subject to very strict restrictions on mounting areas such as a mobile telephone as illustrated in FIG. 7. Further, the capacitor 50 according to the present preferred embodiment, which is formed on the aluminum electrode (element electrode) 20 of the semiconductor chip, can be provided in substantially zero distance, which effectively eliminates the influences of the L component. Further, the constitution of the capacitor 50 according to the present preferred embodiment can easily secure any capacity necessary for controlling the voltage drop of the LSI.

Examples of the mobile communication device are a mobile telephone, and PDA and a laptop computer in which a mounting area is strictly restricted. Further, the semiconductor chip 100 according to the present preferred embodiment is widely applied to other electronic devices such as a digital camera, a digital video camera, and a flat panel display.

So far was described the preferred embodiment of the present invention. The description given so far does not necessarily limit the present invention, and can be variously modified.

INDUSTRIAL APPLICABILITY

According to the present invention, a semiconductor chip comprising a capacitor capable of effectively controlling the voltage drop of an LSI can be provided.

What is claimed is:

1. A semiconductor chip having a conductor substrate provided with an element electrode having at least its surface constituted of an aluminum electrode, wherein
a surface of the aluminum electrode is roughened,
an oxide film is provided on the aluminum electrode,
an electrically conductive film is provided on the oxide film, and
the aluminum electrode, the oxide film and the conductive film constitute a capacitor.

2. The semiconductor chip as claimed in claim 1, wherein the surface of the aluminum electrode is roughened so as to have at least a 50-fold surface expansion ratio.

3. The semiconductor chip as claimed in claim 1, wherein the surface of the aluminum electrode is roughened so as to have at least a 50-fold to 120-fold surface expansion ratio.

4. The semiconductor chip as claimed in claim 1, wherein the surface of the aluminum electrode is roughened so as to have at least a 100-fold surface expansion ratio.

5. The semiconductor chip as claimed in claim 1, wherein conductive polymer molecules constitute the conductive film.

6. The semiconductor chip as claimed in claim 1, wherein a part of the element electrode is covered with a passivation film.

7. The semiconductor chip as claimed in claim 1, wherein a plurality of metallic layers constitute the element electrode, a lowermost layer of the plurality of metallic layers is formed on the semiconductor substrate, and the aluminum electrode is formed on the lowermost layer with a underlaying electrode interposed therebetween.

8. A semiconductor mounting module comprising the semiconductor chip claimed in claim 1 and a mounting substrate on which the semiconductor chip is mounted.

9. A mobile communication device comprising the semiconductor mounting module claimed in claim 5.

* * * * *